United States Patent
Popek et al.

(10) Patent No.: US 11,909,371 B2
(45) Date of Patent: Feb. 20, 2024

(54) EMI STRUCTURE FOR ELECTRONIC CIRCUIT BOX

(71) Applicant: Goodrich Corporation, Charlotte, NC (US)

(72) Inventors: Grzegorz Popek, Birmingham (GB); Stephen Minshull, Bromsgrove (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/890,445

(22) Filed: Aug. 18, 2022

(65) Prior Publication Data

US 2023/0083240 A1 Mar. 16, 2023

(30) Foreign Application Priority Data

Sep. 14, 2021 (EP) ..................................... 21196630

(51) Int. Cl.
*H03H 7/01* (2006.01)
*H03H 1/00* (2006.01)
*B64D 47/00* (2006.01)

(52) U.S. Cl.
CPC ........... *H03H 7/0138* (2013.01); *B64D 47/00* (2013.01); *H03H 7/0115* (2013.01); *H03H 1/0007* (2013.01)

(58) Field of Classification Search
CPC ... H03H 1/0007; H03H 7/0115; H03H 7/0138
USPC ................................................ 333/181, 185
See application file for complete search history.

(56) References Cited

U.S. PATENT DOCUMENTS

| | | | |
|---|---|---|---|
| 4,093,978 A | 6/1978 | Plumer, Jr. | |
| 6,055,164 A | 4/2000 | Chen et al. | |
| 6,061,554 A | 5/2000 | Castella | |
| 7,994,876 B2 | 8/2011 | Feng et al. | |
| 9,401,633 B2 | 7/2016 | Tang et al. | |
| 10,425,056 B2 | 9/2019 | Song et al. | |
| 2008/0024951 A1 | 1/2008 | Mortensen et al. | |
| 2008/0246459 A1 | 10/2008 | Ingman | |

(Continued)

OTHER PUBLICATIONS

European Search Report for Application No. 21196630.4, dated Mar. 11, 2022, 5 pages.

*Primary Examiner* — Rakesh B Patel
(74) *Attorney, Agent, or Firm* — CANTOR COLBURN LLP

(57) ABSTRACT

An EMI filter arrangement includes a noise source, an input filter connected to the input of the noise source, and an output filter connected to the output of the noise source, the noise source, input filter and output filter provided in an electrically conductive electronics box, and an input filter capacitor electrically connecting the input filter to the electrically conductive electronics box and an output filter capacitor electrically connecting the output filter to the electrically conductive electronics box; the arrangement characterised by further comprising an intermediate reference plane provided in the electrically conductive electronics box, and an intermediate capacitor provided in the electrically conductive electronics box electrically connected between the intermediate reference plane and the electrically conductive electronics box, the input filter capacitor and the output filter capacitor being electrically connected to the box via the intermediate reference plane and the intermediate capacitor.

9 Claims, 1 Drawing Sheet

(56) References Cited

U.S. PATENT DOCUMENTS

| | | |
|---|---|---|
| 2016/0056702 A1 | 2/2016 | Halim et al. |
| 2020/0079233 A1* | 3/2020 | Kim ........................ B60L 50/00 |
| 2021/0083568 A1 | 3/2021 | Popek |

* cited by examiner

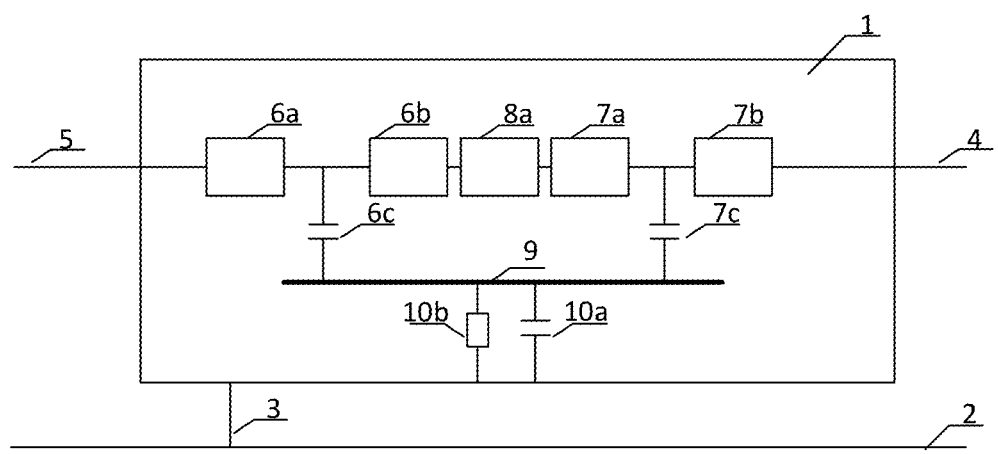

EMI STRUCTURE FOR ELECTRONIC CIRCUIT BOX

CROSS-REFERENCE TO RELATED APPLICATIONS

This application claims priority to European Patent Application No. 21196630.4 filed Sep. 14, 2021, the entire contents of which is incorporated herein by reference.

TECHNICAL FIELD

The present disclosure is concerned with an EMI structure for electronic circuitry in a box connected to the chassis of an aircraft.

BACKGROUND

Particularly with the trend towards more electronic aircraft (MEA) or all electronic aircraft (AEA), many part or loads on an aircraft are controlled by electronic circuitry which can be located at various locations on the aircraft e.g. in the cockpit but also on the wings, tail planes, landing gear and other parts of the chassis. Most electrically controlled loads require a power converter or drive to derive an appropriate level of DC or AC drive power from the aircraft power supply. Such power converters typically include rectifiers and inverters. Because the power converter itself is a source of noise, power converter circuitry includes input and output EMI filters. Common mode chokes are also generally provided to address common mode interference currents that can occur at higher frequencies. Such filters are also typically required for other types of circuit. The power converter circuitry or other circuitry required for control of aircraft parts, including the filters (EMI and, where required, common mode choke) are provided in a circuit box which is mounted to and grounded or electrically referenced to the aircraft chassis. In this way, the input and output filters of the circuitry are connected to the chassis via a capacitor.

Electronic circuit boxes provided on exposed parts of the aircraft can present a risk in the event of an electrical storm and regulations are in place defining criteria with which aircraft must comply to have the necessary lightning insulation strategy. Aircraft manufacturer customers therefore demand that such circuit boxes comply with such requirements. In particular, some airframes impose a limit on the input and output capacitance of the circuit box—i.e. the capacitance seen between the input of the box and the chassis to which it is connected and also between the output of the box and the chassis. In some cases, the requirement is that the capacitance be no greater than e.g. 100 µF to comply with the lightning protection criteria.

The restriction on capacitance values, however, means that in order to provide effective EMI filtering at high power and/or frequency levels, the inductance values of the filters have to be increased. Increasing the inductance requires increasing the size (and weight) of the inductive components of the filters. Even in relatively low frequency ranges, therefore, inductances greater than 100 Ohms are required. Such large inductors cause the overall circuit to be undesirably large and heavy. This is a particular problem on aircraft where the aim is to minimise the size and weight of any parts on the aircraft. This becomes more of a problem where, as is becoming more common, wide band gap switching devices e.g. SiC or GaN are used which switch at higher frequencies and, therefore, require more filter attenuation.

There is, therefore, a need to provide a filter circuit structure whereby the input and output capacitances of the circuit satisfy the industry requirements for lighting insulation strategy and the necessary filter attenuation is ensured without substantially increasing the size of the filter circuit components.

SUMMARY

According to the disclosure, there is provided an EMI filter arrangement comprising a noise source, an input filter connected to the input of the noise source, and an output filter connected to the output of the noise source, the noise source, input filter and output filter provided in an electrically conductive electronics box, and an input filter capacitor electrically connecting the input filter to the electrically conductive electronics box and an output filter capacitor electrically connecting the output filter to the electrically conductive electronics box; the arrangement characterised by further comprising an intermediate reference plane provided in the electrically conductive electronics box, and an intermediate capacitor provided in the electrically conductive electronics box electrically connected between the intermediate reference plane and the electrically conductive electronics box, the input filter capacitor and the output filter capacitor being electrically connected to the box via the intermediate reference plane and the intermediate capacitor such that each of the input and output filter capacitors are connected in series with the intermediate capacitor between their respective one of the input filter and output filter and the box.

The input capacitance seen from the input interface and output interface of the box is the total capacitance resulting from the series connection of the input/output capacitor and the intermediate capacitor.

The input interface and/or the output interface can be AC or DC interfaces.

The noise source is, e.g. a power converter with a power converter input filter and a power converter output filter.

The power converter input filter and the power converter output filter may be inductive, and the input filter and the output filter may consist of a common mode choke.

An intermediate discharge resistor may be provided in the electrically conductive electronics box electrically connected between the intermediate reference plane and the electrically conductive electronics box in parallel with the intermediate capacitor.

BRIEF DESCRIPTION

The FIGURE is a simple schematic diagram showing an EMI scheme in accordance with the disclosure.

DETAILED DESCRIPTION

Examples of the scheme according to this disclosure will now be described with reference to FIG. 1. It should be noted that this is one example only and variations are possible within the scope of the claims.

The electronic circuitry is, as is conventional, provided in a circuit box 1 which is electrically conductive and connected to the aircraft chassis 2 via an electrical bond or bond strap 3. The box has an input interface 5 and an output interface 4. These interfaces can be AC or DC according to the application for which they are used, and can consist of single or multi-phase conductors.

The circuitry within the box 1 will depend on the application to be controlled by the circuit. In the example shown, the circuit includes a power converter 8a with input and output filters. Typically, the input filter part 6a and the output filter part 7b will consist of a common mode choke and filter parts 6b and 7a are inductive in nature.

The converter 8a is a noise source and can be an inverter or rectifier or any other converter causing voltage changes over time that are measurable with reference to the aircraft chassis 2.

In a conventional arrangement the filters 6a/6b; 7a/7b would be referenced to the chassis 2 by a capacitive connection from the filter to the conductive box 1.

Lightning insulation strategy regulations require that the total capacitance of each of the input and output interfaces 5, 4 not exceed a pre-defined maximum value, according to aircraft type. In such conventional arrangements, therefore, this capacitor would define the input/output interface capacitance and may not exceed the pre-defined value, meaning that the inductive parts of the filters would need to be bigger to provide the necessary filter attenuation.

The modification proposed by this disclosure is to provide, within the circuit box 1, an intermediate internal reference plane 9 which is connected to the input EMI filter 6a/6b by a capacitor 6c and is connected to the output EMI filter 7a/7b by a capacitor 7c. The reference plane 9 is then connected to the box 1 (and, hence, the chassis 2 via bond 3) via a further capacitor 10a and preferably, in parallel to the capacitor, a resistor 10b.

The overall input capacitance seen from the input interface 5 is then a series capacitance of capacitor 10a and parallel capacitors 6c and 7c. The total capacitance of two or more capacitors connected in series is less than any one of the series-connected capacitors' individual capacitance. Thus, the total capacitance $C_T$ seen at the input interface 5 will be:

$$C_T = \frac{1}{\frac{1}{C_1} + \frac{1}{C_2}}$$

Where $C_1$ is the capacitance of capacitor 10a and $C_2$ is the sum of the capacitances of parallel capacitors 6c and 7c.

The same applies at the output interface 4.

This means that the capacitors 6c and 7c between the input and output filters and the intermediate reference plane 9 can have a higher value than they could have in conventional arrangements (where they would be directly connected to the conductive box 1 which would provide the interface to the chassis 1) because they are able to exceed the limit on total input/output capacitance imposed by the lightning insulation strategy due to being connected in series with capacitor 10a.

Therefore, the filter attenuation required can be achieved with a combination of capacitors 6c/7c and the filter inductors, without limitations on the capacitor sizes. The increase in filter attenuation is not, therefore, borne only by the inductors, beyond the imposed capacitor limit, so the problem of extremely large inductors is overcome.

Further, the proposed structure creates an internal noise loop within the box 1 in that noise from the converter 8a circulates in the loop defined by the output filter 7a, the output filter capacitor 7c, the intermediate reference plane 9, the input filter capacitor 6c and the input EMI filter 6b. This loop is only effective if the input/output filter capacitors 6c, 7c have high capacitances or if the input/output common mode chokes 6a, 7b are of significant value. The size of the common mode chokes depends on current levels, and it can, therefore, be beneficial to increase the size of these components to result in an overall low weight and low loss device. In this way, high frequency noise can be kept within the box 1 by using higher value capacitors 6c, 7c than the imposed limits to create a low impedance return path for the noise which can return to the noise source 8a.

The provision of the intermediate reference plane 9 and series capacitance 10a allows the size of the inductive components to be kept small whilst providing the required filtering and staying within imposed overall input/output interface capacitance limits. This results in reduction in the overall size and weight of the filter. Losses are also reduced due to the smaller inductors.

To avoid capacitor 10a floating to infinity, which can be detrimental to radiated emissions, a resistor 10b, preferably a high value resistor, is connected in parallel with the capacitor 10a to provide a discharge path between the intermediate reference plane 9 and the chassis 2, via the box 1.

The invention claimed is:

1. An EMI filter arrangement comprising:
   a noise source;
   an input filter connected to the input of the noise source;
   an output filter connected to the output of the noise source;
   an electrically conductive electronics box, wherein the noise source, input filter and output filter are in the electrically conductive electronics box; and
   an input filter capacitor electrically connecting the input filter to the electrically conductive electronics box;
   an output filter capacitor electrically connecting the output filter to the electrically conductive electronics box;
   an intermediate reference plane provided in the electrically conductive electronics box; and
   an intermediate capacitor provided in the electrically conductive electronics box electrically connected between the intermediate reference plane and the electrically conductive electronics box;
   wherein the input filter capacitor and the output filter capacitor are electrically connected to the electrically conductive electronics box via the intermediate reference plane and the intermediate capacitor such that each of the input and output filter capacitors are connected in series with the intermediate capacitor between their respective one of the input filter and output filter and the electrically conductive electronics box;
   wherein the electrically conductive electronics box has an input interface and an output interface, wherein an input capacitance seen from the input interface is the total capacitance resulting from the series connected input capacitor and intermediate capacitor and an output capacitance is the total capacitance resulting from the series connected output capacitor and intermediate capacitor.

2. The EMI filter arrangement of claim 1, arranged to be provided in or on an aircraft in conductive connection with an aircraft chassis.

3. The EMI filter arrangement of claim 1, wherein the input interface and/or the output interface are AC or DC interfaces.

4. The EMI filter arrangement of claim 1, wherein the noise source comprises a power converter.

5. The EMI filter arrangement of claim 4, wherein the noise source further includes a power converter input filter and a power converter output filter.

6. The EMI filter arrangement of claim 5, wherein the power converter input filter and the power converter output filter are inductive.

7. The EMI filter arrangement of claim 1, wherein the input filter and the output filter consist of a common mode choke.

8. The EMI filter arrangement of claim 1, further comprising:
   an intermediate resistor provided in the electrically conductive electronics box electrically connected between the intermediate reference plane and the electrically conductive electronics box in parallel with the intermediate capacitor.

9. The EMI filter arrangement of claim 1, wherein the electrically conductive electronics box is connected to a chassis via an electrical bond.

* * * * *